(12) United States Patent
Berberich

(10) Patent No.: US 6,839,214 B2
(45) Date of Patent: Jan. 4, 2005

(54) OVERVOLTAGE PROTECTION DEVICE

(75) Inventor: Reinhold Berberich, Frankfurt (DE)

(73) Assignee: Mannesmann VDO AG, Frankfurt (DE)

( * ) Notice: Subject to any disclaimer, the term of this patent is extended or adjusted under 35 U.S.C. 154(b) by 467 days.

(21) Appl. No.: 09/833,098

(22) Filed: Apr. 11, 2001

(65) Prior Publication Data

US 2002/0001160 A1 Jan. 3, 2002

(30) Foreign Application Priority Data

Apr. 20, 2000 (DE) .......................................... 100 19 885
Aug. 22, 2000 (DE) .......................................... 100 41 290

(51) Int. Cl.[7] ................................................ H02H 7/20
(52) U.S. Cl. .................................................... 361/112
(58) Field of Search ........................... 361/112; 313/325

(56) References Cited

U.S. PATENT DOCUMENTS

| | | | | |
|---|---|---|---|---|
| 4,431,251 A | * | 2/1984 | Krantz .................. | 439/608 |
| 5,246,388 A | * | 9/1993 | Collins et al. ......... | 439/620 |
| 5,574,615 A | * | 11/1996 | Busse et al. .......... | 361/120 |
| 5,599,208 A | * | 2/1997 | Ward ..................... | 439/620 |
| 5,674,083 A | * | 10/1997 | Whiteman et al. ..... | 439/181 |
| 5,818,101 A | * | 10/1998 | Schuster ................ | 257/659 |
| 5,820,393 A | * | 10/1998 | Edgley et al. ......... | 439/181 |

FOREIGN PATENT DOCUMENTS

| | | | |
|---|---|---|---|
| DE | 3226569 | 7/1983 | ............ H01T/3/00 |
| DE | 3431537 | 3/1986 | ............ H02H/9/04 |
| DE | 3539421 | 5/1987 | ........... G01R/31/02 |
| DE | 3606287 | 9/1987 | ............ H02H/9/06 |
| DE | 3640402 | 6/1988 | ............ H02H/9/04 |
| DE | 3736945 | 9/1988 | ........... H01R/19/42 |
| DE | 3806478 | 9/1989 | ........... H01R/13/66 |
| DE | 3840198 | 5/1990 | ........... H01R/13/66 |
| DE | 3905427 | 8/1990 | ............ H01T/4/06 |
| DE | 4005076 | 8/1991 | ............ H02H/9/04 |
| DE | 19751470 | 6/1999 | ............ H02H/9/06 |
| DE | 19857478 | 6/2000 | ............ H05K/1/14 |
| GB | 2122807 | 1/1984 | ............ H01J/17/38 |

OTHER PUBLICATIONS

Translation of DE 32 26 569 A1.*
Patent Abstracts of Japan vol. 1998 No. 11, Sep. 30, 1998, & JP 10 154854 A (NEC Home Electron Ltd), Jun. 9, 1998.

* cited by examiner

*Primary Examiner*—Ronald Leja
(74) *Attorney, Agent, or Firm*—Martin A. Farber

(57) ABSTRACT

An overvoltage protection device for an electronic apparatus having a plug-in device which has at least one plug-in element and is designed for insertion into a housing of the electronic apparatus. In overvoltage protection in which there is no need for any additional shielding measures from the electronics, a protection board which has a spark gap in order to dissipate overvoltages is arranged on the plug-in element.

14 Claims, 4 Drawing Sheets

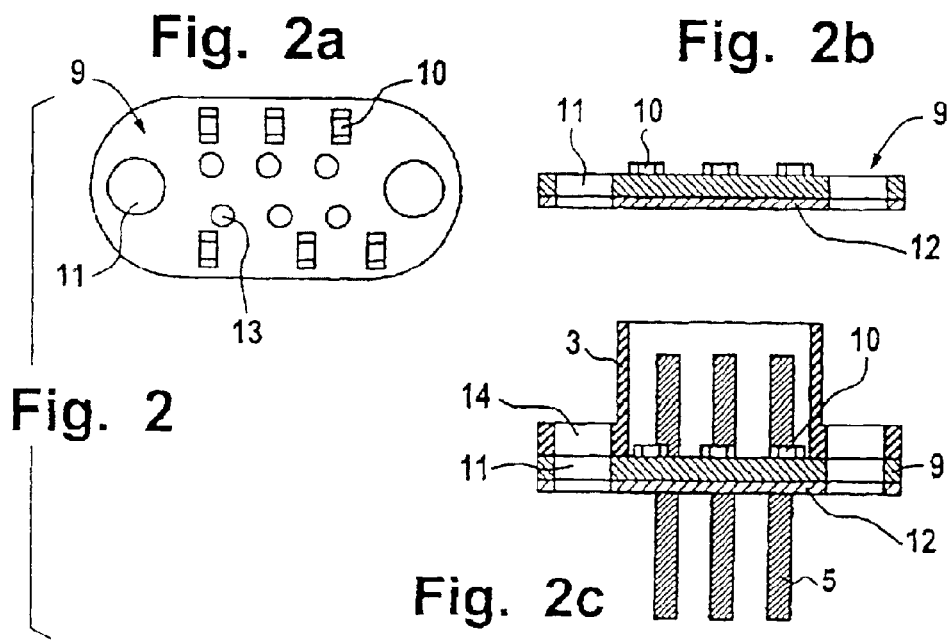
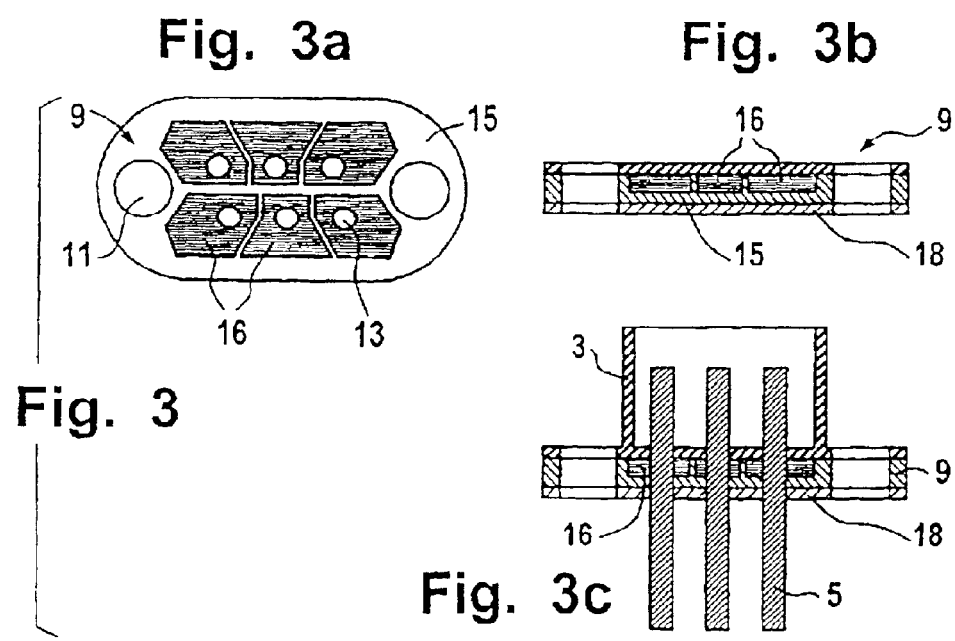

Fig. 4
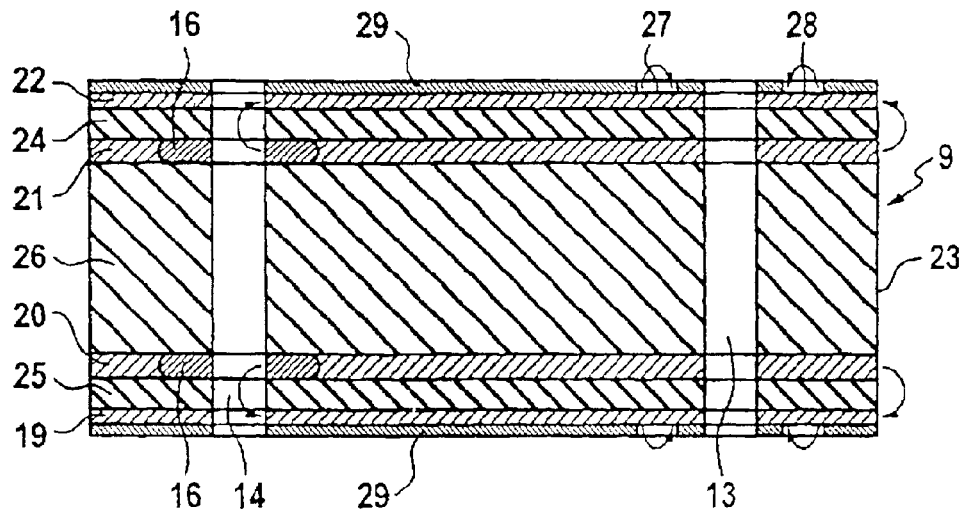
Fig. 6
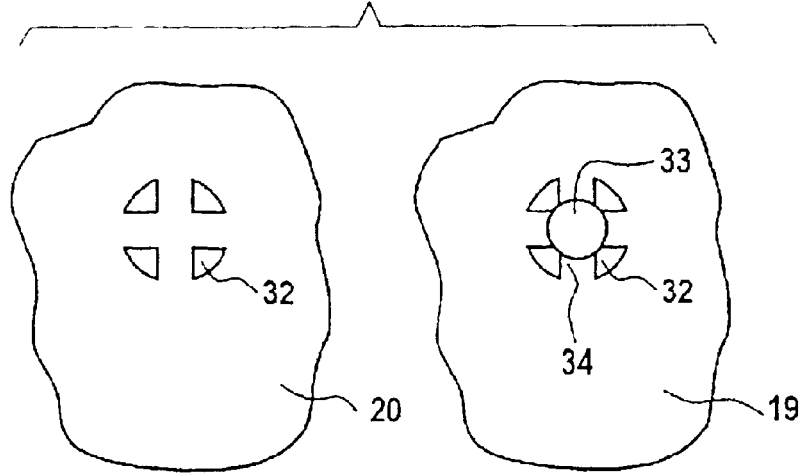
Fig. 6a      Fig. 6b

Fig. 5b (Bottom)

OVERVOLTAGE PROTECTION DEVICE

FIELD AND BACKGROUND OF THE INVENTION

The invention relates to an overvoltage protection device for an electronic apparatus having a plug-in device which has at least one plug-in element and is designed for mounting on a housing of the electronic apparatus.

Voltage-limiting components such as varistors or zener diodes are normally used to protect electronic apparatuses against high voltages. Overvoltage protection elements such as these need to be configured inside the housing so that they do not adversely affect the operation of the electronic components which carry out the function of the apparatus.

The invention is thus based on the object of specifying an overvoltage protection device in which there is no need for any additional shielding measures for the electronics.

SUMMARY OF THE INVENTION

According to the invention, the object is achieved by arranging a protection board, which has a spark gap in order to dissipate overvoltages, on the plug-in element.

The invention has the advantage that the high voltage is dissipated on the outside of the housing itself, and that no shielding measures are required for the components located inside it.

The protection board together with the plug-in element advantageously forms the spark gap.

In a development of the invention, the protection board has an electrically conductive structure in order to form the spark gap. Such etched structures can be produced easily and lead to a spark flashover on the board surface in the horizontal direction.

The electrically conductive structure on the protection board is advantageously in the form of a conductor track, with a zone, which is free of solder resist, of the conductor track being arranged in the vicinity of an opening which holds the plug-in element. The zone which is free of solder resist can easily be incorporated in the solder resist mask by using conventional production methods for printed circuit boards. The spark gap is in this case produced by components such as a plug-in element and a conductor track which are known per se. There is no need for any additional voltage-limiting components.

The spark gap is reliably provided by forming the zone which is free of solder resist in the solder land surrounding the opening.

In a development of the invention, the electrically conductive structure is in the form of a recess which is free of solder resist or an opening through the protection board, and which is advantageously arranged in the vicinity of the plug pin to be protected.

In order to produce a vertical spark flashover, the protection board has two conductor tracks which are located one above the other, are at different potentials and are routed to the board edge, with the thickness of an insulation layer arranged between the two conductor tracks being selected such that the spark gap is formed by the uninsulated ends of the two conductor tracks at the board edge. The thickness of the insulation layer defines the spark gap length, which can be produced very accurately without any increase in effort.

The production process can be simplified further if the board edge is formed by an opening through the protection board. This can be incorporated, for example simply by incorporating a hole, wherever [lacuna] to be protected and the reference-ground potential are located one above the other.

The protection board is advantageously fit with a suppression device to improve the electromagnetic sensitivity of the electronic apparatus. In consequence, both the overvoltage protection and measures to improve the electromagnetic compatibility are integrated on the apparatus connector.

In one refinement, the suppression device is a varistor.

As an alternative to this, the suppression device is a capacitor, which is arranged outside the housing of the electronic apparatus and is electrically connected firstly to the plug-in element of the plug-in device, and secondly to the potential of the electrically conductive housing.

The invention has the advantage that the suppression is provided on the outside of the electronic apparatus itself, and interference radiation cannot penetrate at all into the housing interior. During assembly of the electronic apparatus, a suppression filter is produced simply by inserting the connector into the housing. No additional processing measures are required.

A first capacitor plate of the capacitor is advantageously arranged in or on the plug-in device, as a result of which there is no need for any wires to the capacitor.

The first capacitor plate is preferably formed from the plug-in element itself. It can be produced, for example, simply by upsetting the plug pin. The production of the connector is thus simplified further.

Alternatively, the first capacitor plate is formed by the conductor track which is arranged on the protection board and is in the form of a conductor surface, with the conductor surface being arranged alongside the plug-in element, which is at a first potential, and being electrically connected to it. The electrically designed housing, which is at a second potential, of the electronic apparatus is used as the second capacitor plate. The plug pin, which has no insulation, and the first capacitor surface are connected simply by a positive lock and/or a force fit. This results in a device which can be handled particularly easily for mass production.

In order to provide the second capacitor plate, a second conductor surface which is arranged on the protection board is electrically connected to the housing.

A suppression device which can be handled particularly well in mass production is obtained by producing the electrical connection between the second conductor surface of the protection board and the housing by at least one fastening means which holds the protection board and/or the plug-in device on the housing. The housing potential is in this case produced via screw, rivet or push connections, which are present per se, at at least one point.

In one refinement of the invention, insulation is arranged between the second conductor surface, which is formed on the surface of the protection board, and the outside of the housing. Alternatively, the conductor surface which is arranged on the surface of the protection board may lie directly on the housing.

In one development of the invention, the conductor surface which surrounds the plug-in element is arranged on the protection board such that it can be placed and made contact with on the side of the plug-in device facing the housing. A commercially available connector can thus be provided with the protection board according to the invention. A first capacitor plate is in this case advantageously provided for each plug-in element of the plug-in device, and these first capacitor plates are electrically insulated from one another.

BRIEF DESCRIPTION OF THE DRAWINGS

The invention allows numerous embodiments. One of these will be explained in more detail with reference to the figures illustrated in the drawing, in which:

FIG. 2 shows a first embodiment of the suppression board according to the invention, FIG. 3 shows a second embodiment of the suppression board according to the invention, FIG. 4 shows a third embodiment of the suppression board according to the invention, FIG. 6 shows a capacitor surface with copper-free points.

Identical features are denoted by the same reference symbols.

DETAILED DESCRIPTION OF THE PREFERRED EMBODIMENTS

Figure 1:
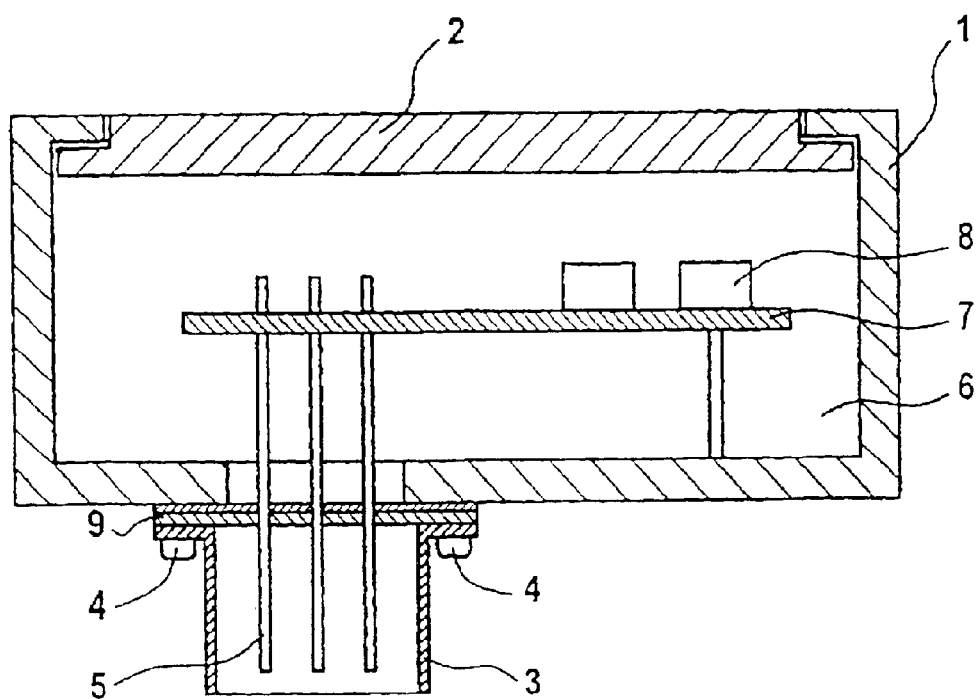
FIG. 1 shows a section through a controller.

FIG. 1 shows an electrical apparatus as is normally used in motor vehicles. This may be a controller for a motor vehicle, which has signal-processing electronics which, as is known, are highly susceptible to radio frequencies. However, it is also feasible for the electronic apparatus to be a sensor device which, in addition to the actual sensor, has a signal preprocessing circuit and/or a signal evaluation circuit, which circuits are arranged on one or more printed circuit boards.

The electronic apparatus has a housing part 1 which is composed of aluminum, is in the form of a cup and is closed by a cover 2. The housing part 1, which is in the form of a cup, has a connector body 3, which is attached to the outside of the housing part 1 by means of screws or rivets 4. The plug pins 5 of the connector body 3 project not only into the connector body 3 but also into the housing interior 3. Via the plug pins 5, the connector 3 connects the circuits of the apparatus to other electronic devices in the motor vehicle.

At least one printed circuit board 7 is arranged in the housing interior 6 and is fit with components 8 which produce the electronic circuits. The plug pins 5, which project into the housing interior 6, are electrically connected to the components 8 located on the printed circuit board 7, in order to supply signals and electrical power.

A suppression board 9, which is mounted together with the connector 3 on the housing part 1, is inserted between the connector 3 and the outside of the housing part 1.

Various embodiments of the suppression board 9 are explained in more detail in FIGS. 2 to 5.

FIG. 2 shows a suppression board 9 with openings 13 for the plug pins 5. A discrete capacitor 10 is provided alongside these openings 13 for each plug pin 5 and is connected by means of wiring arranged on the board 9 such that each capacitor 10 is connected firstly to the plug pin potential and secondly to the potential of the housing 1. The housing potential is in this case normally ground.

The prefabricated board 9 is pushed over the plug pins 5 with a circumferential connector seal 12 surrounding the edge of the board 9, and at the same time sealing it. The board 9 is mounted on the outer skin of the housing part 1 by means of screws 4 which engage in the openings 11 in the board 9 and in the openings 14 in the connector body 3. The attachment process in this case results in the seal 12 lying on the housing part 1. The screws 4 at the same time electrically connect the capacitors 10 to the housing potential.

Another embodiment, in which capacitances are integrated in the board 9, is illustrated in FIG. 3. The board 9 is in the form of a film printed circuit and has a structured connector layer 15. The structure corresponds to individual capacitor surfaces 16 which are insulated from one another. In this case, a capacitor surface 16 is provided for each plug pin 5, and surrounds the opening 13 of the respective plug pin 5. These openings 13 are metallized, with each capacitor surface 16 being connected on the boundary surface to the metallized opening 13, resulting in an electrical connection. After insertion of the plug pins 5, the capacitor surfaces 16 are at the connector potential. In this embodiment, pushing-in processes as electrical connection mechanisms for making contact are particularly advantageous.

On the surface facing the housing, the filter board 9 has a further conductive layer 18 which lies on the housing 1 directly after fitting of the connector 3. It thus assumes the housing potential. This unstructured conductive surface 18 is preferably in the form of conductive adhesive, in order to attach the suppression board 9 to the housing.

Alternatively, the suppression board 9, whose capacitor 16 is insulated from the housing part 1 by the structured conductor layer 18, can also be fit without a conductive surface 18, if the second capacitor plate 18 is itself formed by the housing 1.

This refinement results in each plug pin 5 in itself acting as a capacitor plate and forming a suppression capacitor with the housing part 1, which is connected to ground.

FIG. 4 shows a further embodiment. According to this embodiment, the board 9 is provided with four copper layers 19, 20, 21, 22. Each copper layer 19 and 22 is arranged on a respective one of the two outsides of the board 9. Two further copper layers 20, 21, which are insulated from one another, are located inside the board 9 and form the capacitor surfaces 16, as have been described in conjunction with FIG. 3.

The two outer copper layers 19, 22 are connected via the fastening elements 4 to the housing potential and are electrically isolated from the potential on the plug pins 5. The capacitor surfaces 16 are electrically connected to the plug pins 5 in the manner which has likewise been described. Two pairs of capacitor surfaces are thus produced for each plug pin. If even more pairs of capacitor surfaces are required, then these can easily be produced by further alternate installation of copper layers 20, 21, which form the structured capacitor surfaces 16 and unstructured copper layers 19, 22, which are formed over the entire surface and are at housing potential.

In addition to the embodiment which has been explained, the capacitor surfaces 16 may also be formed by using stamped parts or Kapton films, which are embedded in insulating material. Depending on the material or material combination used for sheathing the capacitor plates, this can at the same time carry out sealing tasks.

The capacitor surfaces according to the invention form capacitances in the range up to 50 pF with the outer housing.

In order to provide overvoltage protection, the uninsulated ends of the copper layers 19, 20, 21, 22 are routed to the edge 23 of the board 9. Alternatively, the copper layers 19, 20, 21, 22 may also end without insulation in an opening 14 in the board 9, which can be produced, for example, by incorporating a hole.

The copper-free points 32 produced during production of the board ensure that, once the hole 33 has been incorporated, conductor tips 34 are produced, which assist the spark flashover. (FIG. 6).

An insulation layer 25 is arranged between the copper layers 19 and 20, and an insulation layer 24 between the copper layers 21 and 22. The copper layers 21 and 20 are separated by a third insulation layer 26 whose thickness, for strength reasons, is a multiple of the thickness of the respective insulation layer 24 or 25, since it acts as a supporting layer. Owing to the thickness of the insulation layers 24, 25, the air gap between the copper layers 19 and 20, and 21 and 22, is very small, so that a spark flashover occurs between these two copper layers in the event of an overvoltage.

A solder resist structure 29 is applied to the surface of the copper layers 19 and 20 and covers the opening 13, which holds the plug-in elements 5, and the conductor track adjacent to it.

The solder resist structure 29 is interrupted at intended points, so that the copper layers 19, 22 are exposed at these points. Further electrically conductive and uninsulated holes 27, 28 on the surface of the board 9 thus form a horizontal spark flashover path.

Figure 5:
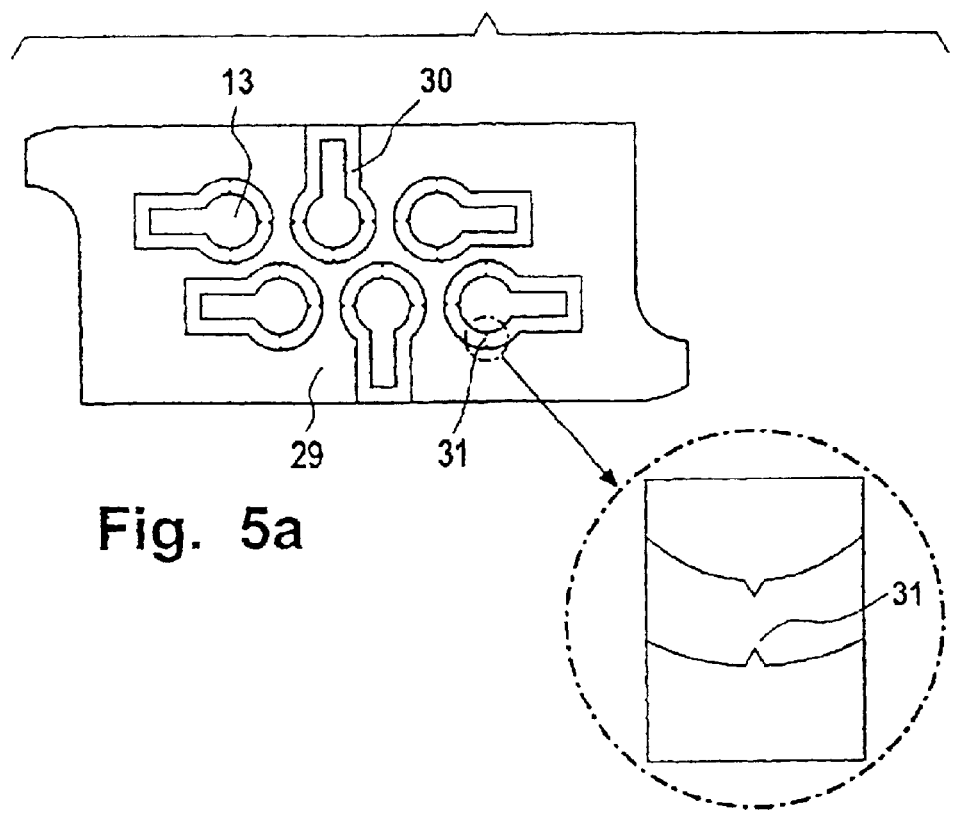
FIG. 5 shows a fourth embodiment of the suppression board according to the invention.
Figure 5A:
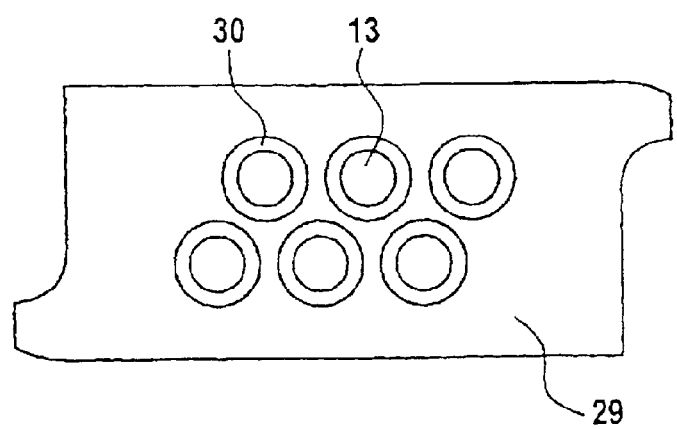

Furthermore, it is possible, as illustrated in FIG. 5, for the width of the solder lands 30 which surround the opening 13 to be narrowed, in order to allow a spark flashover.

To this end, the solder resist structure 29 is applied with the aid of a solder resist mask, in which constrictions 31 to expose the copper layer 19 or 22 located underneath are provided at uniform intervals in the solder resist in the region of the solder resist land 30. In the present case, three constrictions 31 are provided at 90° intervals. The constriction 31 is shown enlarged. The proximity between the constriction 31 and the plug-in element 3 results in flashover points for a potential spark flashover.

Solder resist lands 30 are provided on the rear face (bottom) of the board 9, in this case having a conventional, circular shape.

What is claimed is:

1. An overvoltage protection device for an electronic apparatus having a plug-in device which has at least one plug-in element and is mountable on a housing of the electronic apparatus wherein a protection board (9) having a spark gap to dissipate overvoltages is arranged on the plug-in element (3); wherein the protection board (9) forms the spark gap together with the plug-in element (3); wherein the protection board (9) has an electrically conductive structure (19, 22) forming the spark gap; wherein the electrically conductive structure of the protection board (9) has a form of a conductor track, with a zone (27, 2B; 31) of the conductor track which is free of solder resist being arranged in a vicinity of an opening (13) accommodating a plug-in elememt (5), and wherein the zone (31) which is free of the solder resist is formed in a solder land (30). which surrounds the opening (13), in the solder resist (29).

2. The overvoltage protection device as claimed in claim 1, wherein the protection board (9) is fitted with a suppression device (10; 15, 16) to improve electromagnetic sensitivity of the electronic apparatus (1); and wherein the suppression device (10) is a varistor.

3. An overvoltage protection device for an electronic apparatus having a plug-in device which has at least one plug-in element and is mountable on a housing of the electronic apparatus, wherein a protection board (9) having a spark gap to dissipate overvoltages is arranged on the plug-in element (3); wherein the protection board (9) forms the spark gap together with the plug-in element (3); wherein the protection board (9) has an electrically conductive structure (19, 22) forming the spark gap; wherein the electrically conductive structure has a form of a recess, which is free of solder resist, and/or a plurality of openings (27, 28) through the protection board (9), wherein the recess and/or the plurality of openings (27, 28) which are free of the solder resist is arranged about an opening (13) in a vicinity of a plug pin (5) to be protected.

4. An overvoltage protection device for an electronic apparatus having a plug-in device which has at least one plug-in element and is mountable on a housing of the electronic apparatus, wherein a protection board (9) having a spark gap to dissipate overvoltages is arranged on the plug-in element (3); wherein the protection board (9) has at least two conductor tracks (19, 20; 21, 22) which are located one above another, are at different potentials, and are routed to a board edge (23), with a thickness of an insulation layer (24, 25) which is arranged between the two conductor tracks (19, 20; 21, 22) being selected such that the spark gap is formed by uninsulated ends of the two conductor tracks (19, 20; 21, 22) at the board edge (23).

5. The overvoltage protection device as claimed in claim 4, wherein a shape of the conductor tracks (19, 20, 21, 22) which are routed to the board edge (23) is selected such that conductor tips (34) are produced at the board edge (23).

6. The overvoltage protection device as claimed in claim 4, wherein the board edge (23) is formed by at least one opening (14) through the protection board (9).

7. An overvoltage protection device for an electronic apparatus having a plug-in device which has at least one plug-in element and is mountable on a housing of the electronic apparatus, wherein a protection board (9) having a spark gap to dissipate overvoltages is arranged on the plug-in element (3); wherein the protection board (9) is fitted with a suppression device (10; 15, 16) to improve electromagnetic sensitivity of the electronic apparatus (1); wherein the suppression device comprises a capacitor (10) which is arranged outside the housing (1, 2) of the electronic apparatus (1) and is electrically connected firstly to the plug-in element (5) of the plug-in device (3); and secondly to potential of the electrically conductive housing 1, 2); wherein a first capacitor plate (16) of the capacitor (10) is arranged in or on the plug-in device (3); and the first capacitor plate (16) is formed from the plug-in element (5).

8. The overvoltage protection device as claimed in claim 7, wherein a first capacitor plate (16) of said capacitor and of additional capacitors of said suppression device is provided for each plug-in element (5), and each of the first capacitor plates (16) is electrically isolated from one another.

9. The overvoltage protection device as claimed in claim 7, wherein the suppression device has a plurality of capacitors of which a first capacitor plate (16) of a respective capacitor is provided for each plug-in element (5), and each of the first capacitor plates (16) is electrically isolated from one another.

10. An overvoltage protection device for an electronic apparatus having a plug-in device which has at least one plug-in element and is mountable on a housing of the electronic apparatus, wherein a protection board (9) having a spark gap to dissipate overvoltages is arranged on the plug-in element (3); wherein the protection board (9) is fitted with a suppression device 10; 15, 16 to improve electromagnetic sensitivity of the electronic apparatus (1); wherein the suppression device comprises a capacitor (10) which is arranged outside the housing 1, 2) of the electronic apparatus (1) and is electrically connected firstly to the plug-in element (5) of the plug-in device (3), and secondly to potential of the electrically conductive housing (1, 2); wherein a first capacitor plate (16) of the capacitor (10) is arranged in or on the plug-in device (3); and the first capacitor plate (16) is formed by one of the conductor tracks (15) which are arranged on the protection board (9) and are in a form of conductor surfaces, said conductor track (15) is arranged alongside the plug-in element (5) and is electrically connected to said element, and wherein the electrically formed housing (1), which is connected to ground, of the electronic apparatus is used as a second capacitor plate.

11. The overvoltage protection device as claimed in claim 10, wherein a second conductor surface (18) which is arranged on the protection board (9) and is electrically connected to the housing (1, 2) forms a second capacitor surface with the housing (1, 2).

12. The overvoltage protection device as claimed in claim 11, wherein the electrical connection between the second conductor surface (15) of the protection board (9) and the housing (1, 2) is produced by at least one fastening means (4) for holding the protection board (9) and/or the plug-in device (3) on the housing (1, 2).

13. The overvoltage protection device as claimed in claim 11, wherein insulation (17) is arranged between the second conductor surface (18), which is formed on a surface of the protection board, and the outside of the housing (1, 2).

14. The overvoltage protection device as claimed in claim 11, wherein the conductor surface (16) surrounding the plug-in element (5) is arranged on the protection board (9) such that it is placable and made contactable on a side of the plug-in device (3) facing the housing (1).

* * * * *